United States Patent [19]
Tien

[11] Patent Number: 5,997,589
[45] Date of Patent: Dec. 7, 1999

[54] ADJUSTMENT PUMPING PLATE DESIGN FOR THE CHAMBER OF SEMICONDUCTOR EQUIPMENT

[75] Inventor: Yu-Chung Tien, Hsinchu, Taiwan

[73] Assignee: Winbond Electronics Corp., Hsinchu, Taiwan

[21] Appl. No.: 09/113,018

[22] Filed: Jul. 9, 1998

[51] Int. Cl.$^6$ ........................................... H01S 4/00
[52] U.S. Cl. ........................... 29/25.01; 29/592.1; 438/5; 438/935
[58] Field of Search .................. 438/5, 9, 10, 710, 438/905, 935; 29/25.01, 25.02, 592, 592.1; 96/400; 118/723 E; 117/102

[56] References Cited

U.S. PATENT DOCUMENTS

| | | | |
|---|---|---|---|
| 4,836,233 | 6/1989 | Milgate | 438/935 |
| 4,859,625 | 8/1989 | Matsumoto | 438/935 |
| 5,015,327 | 5/1991 | Taguchi et al. | 117/102 |
| 5,261,935 | 11/1993 | Ishii et al. | 96/400 |
| 5,702,562 | 12/1997 | Wakahara | 438/9 |
| 5,900,103 | 5/1999 | Tomoyasu et al. | 118/723 E |

Primary Examiner—Donald L. Monin, Jr.
Assistant Examiner—Michael Dietrich
Attorney, Agent, or Firm—W. Wayne Liauh

[57] ABSTRACT

A semiconductor fabrication chamber is disclosed which contains (a) a main chamber; (b) a baffle member separating the main chamber into a first chamber and a second chamber, (c) a vacuum pump to pump gas through the main chamber; and (d) a computer. The first chamber contains a gas inlet, a metering device, and a supporting member to support a wafer to be fabricated, and the second chamber contains a gas outlet and a first pressure gauge. The baffle member contains at least one adjustable opening which is controllable by the computer. Prior to a fabrication process, such as plasma etching, a pressure difference between the first pressure gauge and a temporary pressure gauge installed inside the second chamber is calculated and compared against a standard value, and the computer will adjust the opening of the baffle plate so as to minimize such pressure difference, which is related to the deposition of particulate matters on the opening. A flow meter can also be installed inside the second chamber for adjustment of the baffle plate opening during the fabricating process.

16 Claims, 6 Drawing Sheets

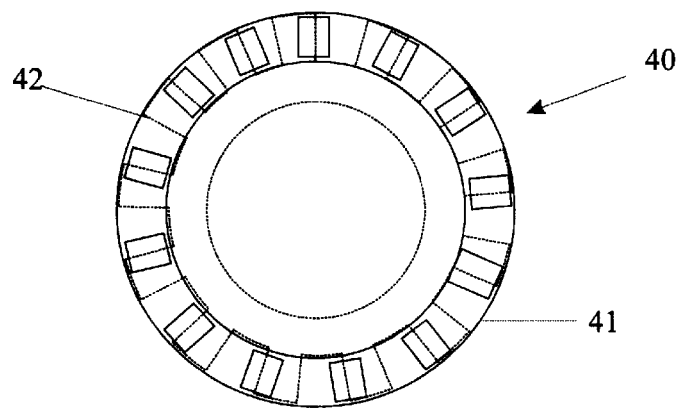
Fig. 5A
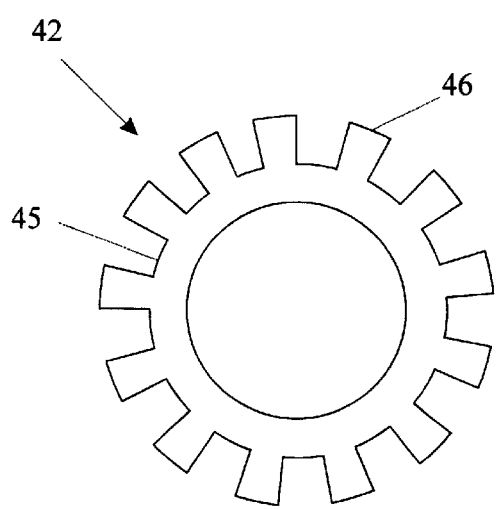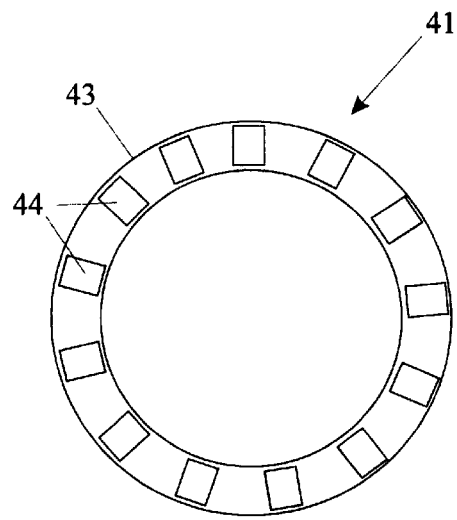
Fig. 5B    Fig. 5C

ADJUSTMENT PUMPING PLATE DESIGN FOR THE CHAMBER OF SEMICONDUCTOR EQUIPMENT

FIELD OF THE INVENTION

The present invention relates to a semiconductor fabrication chamber with an improved gas pressure and/or pump speed control mechanism. More specifically, the present invention relates to an improved pressure and/or pump speed control system that will allow the semiconductor fabrication chamber equipped with such system to be operated closer to the designed conditions, so as to improve the quality of the semiconductor devices fabricated therein, and thus minimizes the number of product rejects.

BACKGROUND OF THE INVENTION

Most of the fabrication processes for semiconductor devices are conducted in a semi-closed fabrication chamber with the continuous flow of one or more gaseous components therethrough via a vacuum pump, which is typically a turbo pump. These processes include plasma etching, reactant ion etching, and various modes of chemical vapor deposition, etc. To facilitate the even distributions of the flowing gas, a baffle plate, or exhaust plate, is horizontally installed inside the fabrication chamber, dividing the fabrication chamber into an upper chamber and a lower chamber.

FIG. 1 shows an illustrative schematic cross-sectional view of a conventional semiconductor fabrication chamber used in reactive ion etching (RIE) processes. The chamber 11 is divided by a horizontally disposed baffle plate (or exhaust plate) 12 into an upper chamber 13 and a lower chamber 14. The fabrication chamber 11 also includes a cathode 15, a focusing ring 16, and an electrostatic chuck (ESC) 17 upon which a wafer 18 is disposed. The fabrication chamber 11 is enclosed by a chamber wall 19 and a chamber lid 20. An insulating ring 21 is placed between the baffle plate 12 and the cathode 15.

FIG. 1 also shows that a turbo pump 22 and a throttle valve 23 are used to pump one or more gases into the fabrication chamber 11. FIG. 2 is a top view of a conventional baffle plate 12. Typically, the baffle plate 12 is a ring-shaped plate having a plurality of radially extending perforations 24. The baffle plate 12 is typically separated from the cathode 15 by an insulating ring 21.

To control the pressure inside the fabrication chamber and the flow of gas into the chamber, a pressure gauge 25 is often installed. The pressure gauge 25 is connected to the throttle valve 23 via a CPU 26, as shown in FIG. 3. Analog signals obtained from the pressure gauge 25 are converted into digital signals by a D/A converter, which are then compared against a predetermined value stored in the CPU. The CPU then sends control signals to the throttle valve so that appropriate adjustments can be made to maintain the gas pressure inside the fabrication chamber at or close to the predetermined value. During plasma-related fabrication processes, such as plasma etching, plasma-enhanced chemical vapor deposition, etc., because plasma, or ionized gas, can cause instability in the pressure measurement, the pressure gauge is typically installed in the lower chamber, to avoid interference from the plasma gas.

It was discovered by the inventor of the present invention that, after repeated usage of the fabrication chamber, certain particulate materials, such as polymers that are formed during a plasma etching process, can accumulate on the baffle plate, thus reducing the openings of the baffle plate through which reactant gas enters. As a result, the pressure gauge, which is located in the lower chamber, may not accurately tell the true pressure in the upper chamber. This resulted in inadequate and improper pressure control inside the fabrication chamber. In many cases, this problem can explain the reduced fabrication yield rates. This problem, which becomes more noticeable and serious as the fabrication of semiconductor devices moves into sub-micron age, which requires more precise control of the gas pressure inside the fabrication chamber, also becomes more profound with extended usage of the fabrication chamber.

As semiconductor devices are becoming more like a common commodity, the profit margin of fabricating semiconductor devices is constantly decreasing. As a result, it is important to look at every process parameter that may affect the failure or rejection rate of the fabricated products, so as to reduce production cost. Since imprecise pressure control inside the fabrication chamber can have a significant impact on the product rejection rate, it is important that the above-mentioned problem be carefully studied at and that a suitable solution be developed so as to improve the product yield rate.

SUMMARY OF THE INVENTION

The primary object of the present invention is to develop an improved semiconductor fabrication chamber which will allow more accurate pressure measurement and control during the semiconductor fabrication process so as to reduce the products rejection rate. More specifically, the primary object of the present invention is to develop an improved pressure measurement system for use in a semiconductor fabrication chamber so that the gas/plasma pressure inside the fabrication chamber can be more precisely controlled at or close to the designed value so as to improve the production yield and therefore reduce the overall production cost. The system developed in the present invention can also be advantageously used to maintain gas flow rate (i.e., pumping rate) into the fabrication chamber at the intended level.

It was discovered by the inventor of the present invention that, after repeated usage, a noticeable amount of particulate matters, such as polymers that are formed during plasma etching, can accumulate on the surface of the baffle plate which separate the semiconductor fabrication chamber into upper and lower chambers. As a result, readings from the pressure gauge often do not accurately reflect the true pressure inside the active fabrication chamber, which typically is the upper chamber. This inaccurate pressure measurement had led to inadequate pressure or flow rate control inside the active fabrication chamber and resulted in increased products rejection rate, and thus increased semiconductor production cost.

As it was discussed earlier, during plasma-related fabrication processes, such as plasma etching, plasma-enhanced chemical vapor deposition, etc., because the plasma gas, or ionized gas, can cause instability in the pressure measurement, the pressure gauge is typically installed in the lower chamber, to avoid interference from the plasma gas. While the upper chamber and the lower chamber are separated by the baffle plate, the openings on the baffle plate are typically wide enough (but not too wide to interfere the purpose of installing the baffle plate) so that the pressures in the two chambers will not differ significantly. With the accumulation of particulate matters on the baffle plate, the openings thereof can be reduced to an extent such that pressure equilibrium between the two chambers may not be achieved instantly, resulting in inaccurate reading of the upper chamber pressure and inadequate pressure control of the fabrication process.

In the present invention, a baffle member with adjustable openings is developed which will eliminate the problems described above associated with pressure in-equilibrium and allow the pressure inside the active fabrication chamber to be accurately controlled. To utilize this adjustable-opening baffle plate, the fabrication chamber is also modified. A second pressure gauge is installed in the upper chamber, or the active fabrication chamber. Before the plasma related process commences, i.e., before the RF generator is turned on, the turbo pump (a vacuum pump) is turned on and the processing gas is allowed to enter. Because of the existence of the baffle member, a finite pressure difference, which will be very small but can be significant due to the need for precise control of the semiconductor fabrication process, will be observed between the upper chamber and the lower chamber under normal flowing conditions. In other words, because the second pressure gauge is closer to the gas inlet and the first pressure gauge is closer to the pumping port, the pressure measured at the second pressure gauge will be somewhat greater than that at the first pressure gauge under normal flowing conditions. This finite pressure difference is recorded in a computer as the reference pressure difference.

After the "reference pressure difference" is determined and recorded, pressure readings from the first and second pressure gauges are measured again during subsequent fabrication processes but before the plasma related process is started. The difference between the two readings is sent to the computer, which then causes the openings of the baffle member to be adjusted until the difference in the readings matches the reference pressure difference. Through the use of such baffle member with adjustable-openings and modifications in the fabrication chamber, the effect of accumulations of particulate objects on the baffle member can be largely neutralized, and the pressure inside the active fabrication chamber can be accurately controlled.

In another embodiment of the present invention, the adjustable-openings of the baffle member are utilized to adjust flow rate of gas components into the fabrication chamber. In this embodiment, the second pressure gauge inside the active fabrication chamber is replaced with a flow meter. This change is particularly useful when pumping rate, rather than the pressure inside the active fabrication chamber, is more important. In this embodiment, readings from the flow meter and the first pressure gauge are made during normal operating conditions (typically when the fabrication chamber is new or freshly cleaned). The measured values are called the reference flow rate and the reference outlet pressure, respectively. During subsequent fabrication processes, before or after the plasma related process, flow rate and pressure readings are taken at the flow meter and the first pressure gauge, respectively. These values are compared against the reference flow rate and reference outlet pressure, respectively, in a computer. If the difference between the measured flow rate and the reference flow rate exceeds a predetermined tolerance, the computer will send a signal to adjust the openings of the baffle member until they are equal, i.e., within the predetermined tolerance. On the other hand, if the difference between the pressure reading at the first pressure gauge and the reference outlet pressure exceeds another predetermined tolerance, the computer will send another signal to adjust the throttle valve until they are equal, i.e., withing the predetermined tolerance.

The second embodiment is particularly useful if the fouling, or solid build-up, around the baffle plate openings are rapid, thus raising the need to adjust the baffle plate opening even during the fabrication process.

BRIEF DESCRIPTION OF THE DRAWING

The present invention will be described in detail with reference to the drawing showing the preferred embodiment of the present invention, wherein:

FIG. 5A is an illustrative schematic top view of the adjustable-openings baffle member according another preferred embodiment of the present invention which comprises a fixed baffle plate and a rotatable baffle plate.

FIG. 5B is an illustrative schematic top view of the rotatable baffle plate of the baffle member as shown in FIG. 5A.

FIG. 5C is an illustrative schematic top view of the fixed baffle plate of the baffle member as shown in FIG. 5A.

DETAILED DESCRIPTION OF THE PREFERRED EMBODIMENT

The present invention discloses an improved semiconductor fabrication chamber which allows more accurate pressure and/or flow rate control in the plasma chamber during the semiconductor fabrication process so as to improve the production yield and therefore reduce the overall production cost. The present invention solves a problem that was never identified in the semiconductor industry in that noticeable amounts of particulate matters can accumulate on the surface of the baffle plate separating the semiconductor fabrication chamber into upper and lower chambers. As a result, readings from the pressure gauge often do not accurately reflect the true conditions inside the active fabrication chamber, which is typically the upper chamber where the pressure is located. This inaccurate pressure measurement had led to inadequate pressure or flow rate control inside the active fabrication chamber and resulted in increased products rejection rate and thus increased semiconductor production cost.

Figure 1:
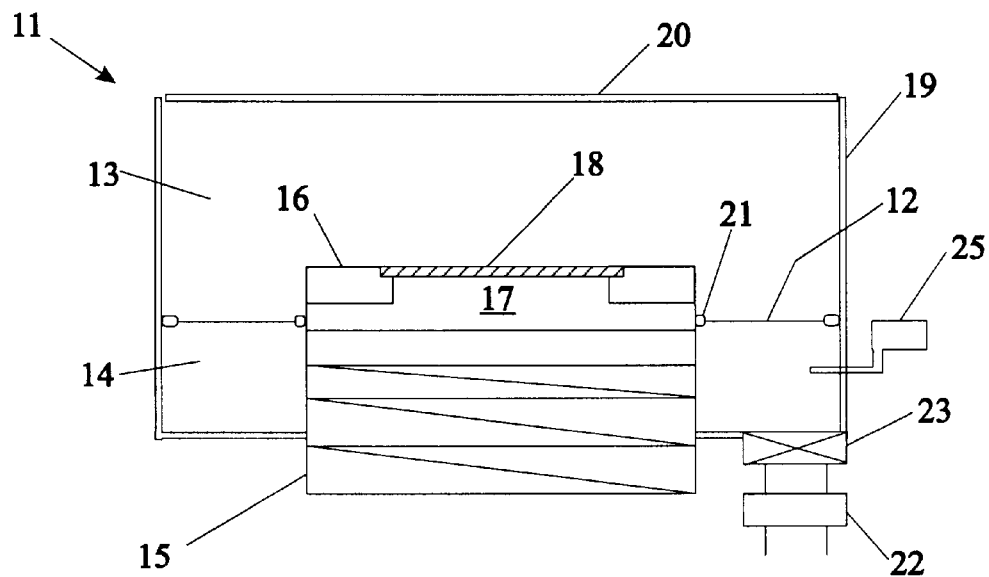
FIG. 1 is an illustrative schematic side cross-sectional view of a conventional semiconductor fabrication chamber.
Figure 2:
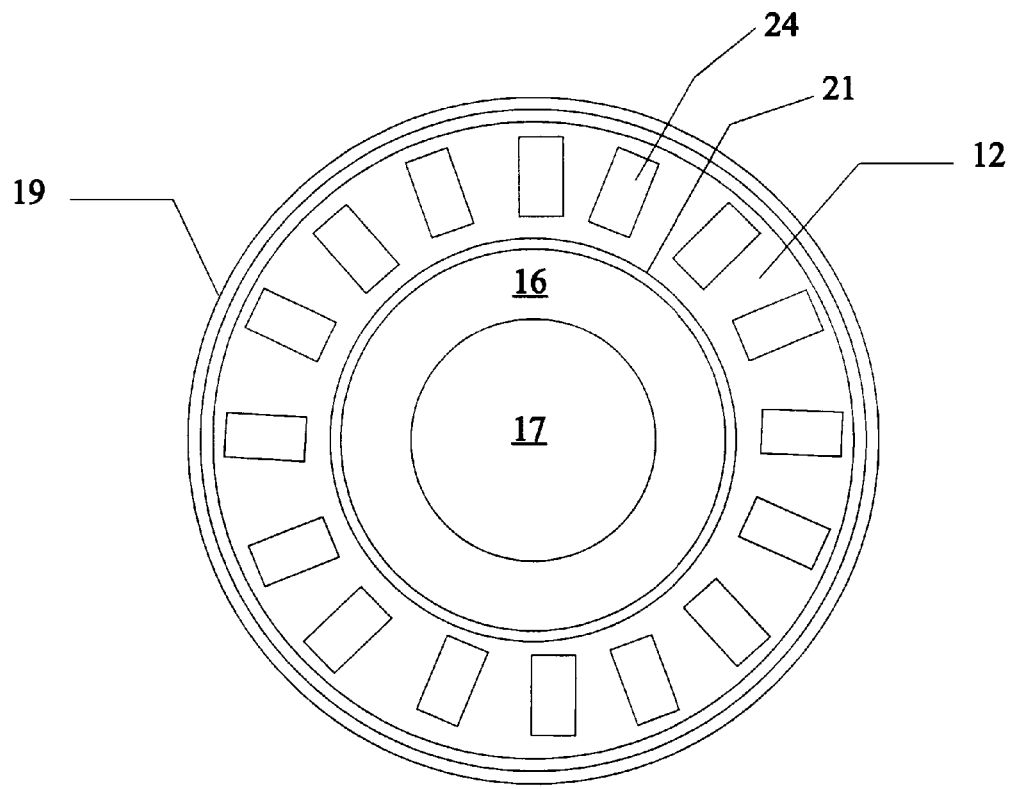
FIG. 2 is an illustrative schematic top cross-section view of the conventional semiconductor fabrication chamber as shown in FIG. 1.
Figure 3:
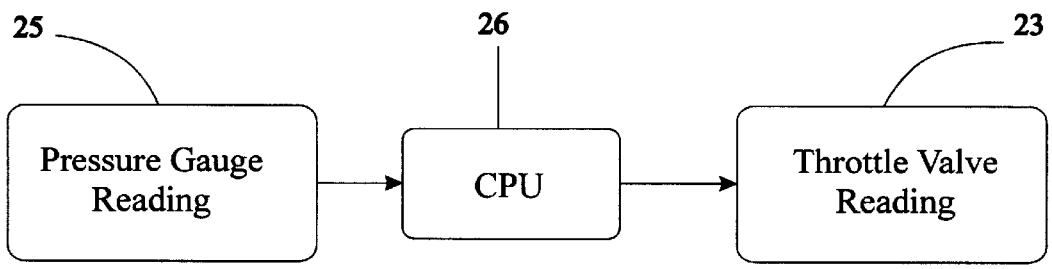
FIG. 3 is a flowchart diagram illustrating the pressure control within the conventional semiconductor fabrication chamber as shown in FIG. 1.

FIG. 1 is an illustrative schematic side cross-sectional view of a conventional semiconductor fabrication chamber for use in reactive ion etching (RIE) process. FIG. 2 is an illustrative schematic top cross-sectional view of the conventional semiconductor fabrication chamber as shown in FIG. 1. And FIG. 3 shows a flowchart diagram illustrating the pressure control within the conventional semiconductor fabrication chamber as shown in FIG. 1.

As shown in FIGS. 1 and 2, the chamber 11 is divided by a horizontally disposed baffle plate, or the so-called exhaust plate 12, into an upper chamber 13 and a lower chamber 14. The fabrication chamber 11 also includes a cathode 15, a focusing ring 16, and an electrostatic chuck (ESC) 17 upon which a wafer 18 is disposed. The fabrication chamber 11 is enclosed by a chamber wall 19 and a chamber lid 20. An insulating ring 21 is placed between the baffle plate 12 and the cathode 15. FIG. 1 also shows that a turbo vacuum pump 22 and a throttle valve 23 are used to pump gas through the fabrication chamber 11. FIG. 2 is a top view of a conventional baffle plate 12. Typically, the baffle plate 12 is a ring-shaped plate having a plurality of radially extending perforations 24. The baffle plate 12 is typically separated from the cathode 15 by an insulating ring 21. To control the pressure inside the fabrication chamber and the flow of gas into the chamber, a pressure gauge 25 is installed which is connected to the throttle valve 23 via a CPU 26, as shown in FIG. 3. Analog signals obtained from the pressure gauge 25 are converted into digital signals, which are then compared with a predetermined value stored in the CPU. The CPU then sends control signals to the throttle valve so that appropriate adjustments can be made to maintain the pressure inside the fabrication chamber at, or within a tolerance of, the predetermined value. As discussed earlier, during plasma-related fabrication processes, such as plasma etching, plasma-enhanced chemical vapor deposition, etc., because the plasma, or ionized gas, can cause instability in pressure measurement, the pressure gauge is typically installed in the lower chamber, to avoid interference from the plasma gas. This causes some problems in that, after repeated usage of the fabrication chamber, certain particulate materials, such as polymers during a plasma etching process, will accumulate on the baffle plate, thus reducing the size of openings of the baffle plate through which the reactant gas enters. As a result, the pressure gauge, which is located in the lower chamber, does not accurately tell the true pressure in the upper chamber.

Figure 4A:
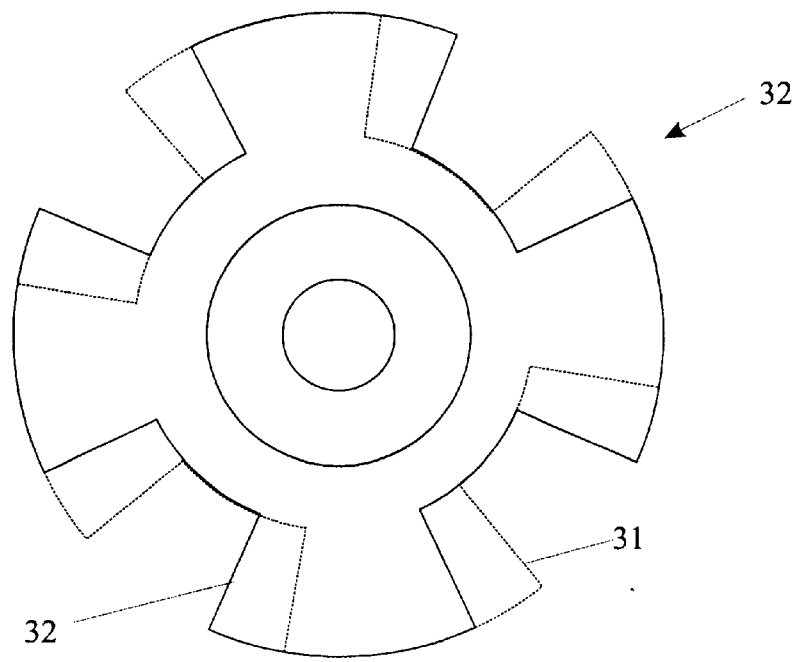
FIG. 4A is an illustrative schematic top view of the adjustable-openings baffle member according a preferred embodiment of the present invention which comprises two identically structured fixed and rotatable baffle plates.
Figure 4B:
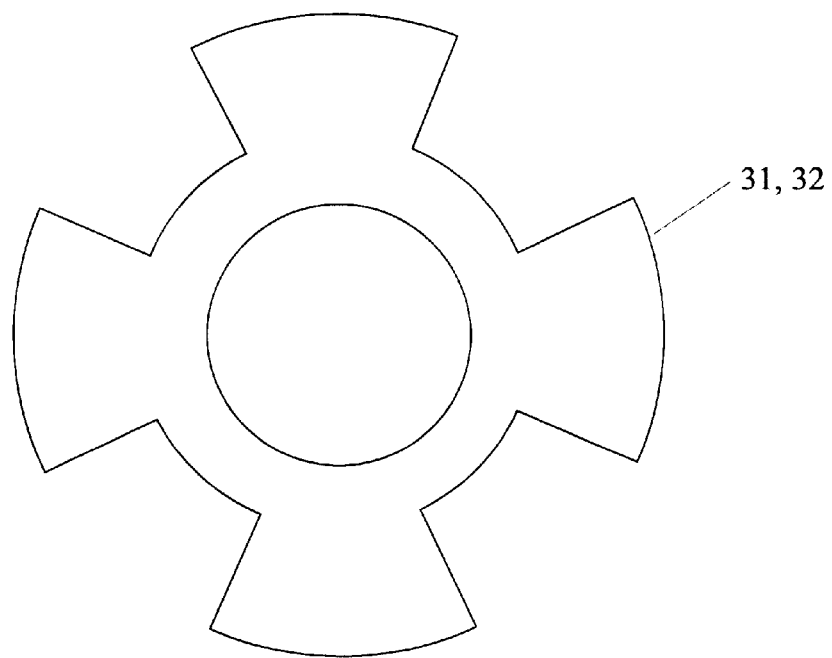
FIG. 4B is an illustrative schematic top view of the fixed and rotatable baffle plates of the baffle member as shown in FIG. 4A.

FIG. 4A is an illustrative schematic top view of the adjustable-openings baffle member 30 according to a preferred embodiment of the present invention relating to the baffle design which comprises two identically structured fixed and rotatable baffle plates, 31 and 32. FIG. 4B is an illustrative schematic top view of the fixed or rotatable baffle plate of the baffle member as shown in FIG. 4A. The baffle plate in the prior art is renamed as baffle member in the present invention, as the latter comprises a plurality of baffle plates to provide adjustable openings.

FIG. 5A is an illustrative schematic top view of the adjustable-openings baffle member 40 according to another preferred embodiment of the present invention which comprises a fixed baffle plate 41 and a rotatable baffle plate 42. In the second embodiment, the fixed baffle plate 41 has a ring structure 43 with a plurality of perforations 44, as shown in FIG. 5C. FIG. 5B is an illustrative schematic top view of the rotatable baffle plate of the baffle member as shown in FIG. 5A. The rotatable baffle plate 42 has an inner ring 45 with a plurality of radiating fins 46.

Figure 6:
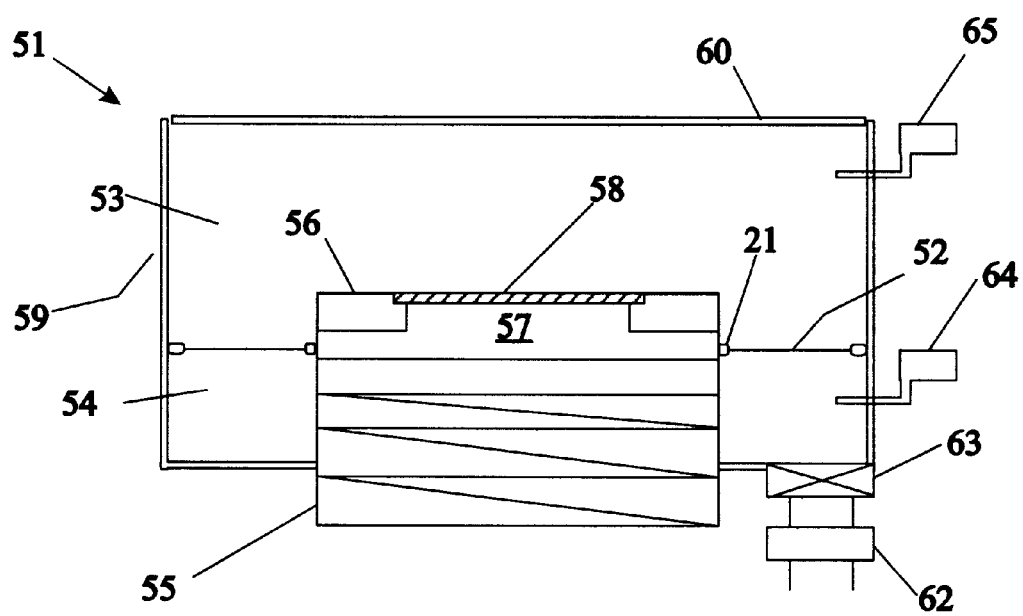
FIG. 6 is an illustrative schematic side cross-section view of the semiconductor fabrication chamber according to a preferred embodiment of the present invention.

FIG. 6 is an illustrative schematic side cross-section view of the semiconductor fabrication chamber according to a preferred embodiment of the present invention. Similar to the conventional fabrication chamber, the fabrication chamber 51 of the present invention is divided by a horizontally disposed baffle plate 52 into an upper chamber 53 and a lower chamber 54. The fabrication chamber 51 also includes a cathode 55, a focusing ring 56, an electrostatic chuck 57 upon which a wafer 58 is disposed. The fabrication chamber 51 is enclosed by a chamber wall 59 and a chamber lid 60.

FIG. 6 also shows that a turbo vacuum pump 62 and a throttle valve 63 are used to pump gas through the fabrication chamber 61. A first pressure gauge 64 is installed in the lower chamber 54. One main difference between the present invention and the conventional fabrication chamber is that the baffle plate 52 has adjustable openings as shown in FIG. 4A–4B, or FIG. 5A–5C.

In this embodiment of the present invention relating to process implementation, a second pressure gauge 65 is also installed in the upper chamber 54, which is the active fabrication chamber. Before the radio frequency generator is turned on, the turbo vacuum pump is turned on and the process gas is allowed to enter into the upper chamber. Because of the existence of the baffle plate, a small but finite pressure difference will be observed between the upper chamber and the lower chamber under normal flowing conditions. In other words, because the second pressure gauge is closer to the gas inlet and the first pressure gauge is closer to the pumping port, or gas outlet, the pressure measured at the second pressure gauge will be greater than that at the first pressure gauge by finite difference, under normal flowing conditions. Such a finite pressure difference is recorded in the computer 66 as a reference pressure difference.

Figure 7:
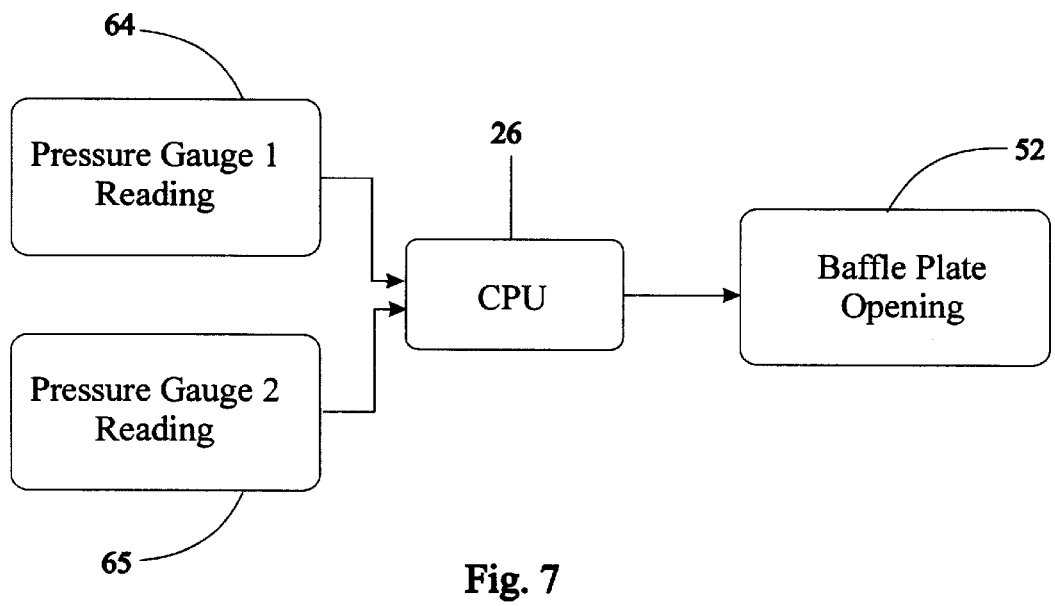
FIG. 7 is a flowchart diagram illustrating the pressure control process within the semiconductor fabrication chamber according to a preferred embodiment of the present invention which utilizes first and second pressure gauges near the pump inlet and the gas inlet, respectively.

FIG. 7 is a flowchart diagram illustrating the pressure control process within the semiconductor fabrication chamber according to this preferred embodiment of the present invention which utilizes first and second pressure gauges near the pump inlet and the gas inlet, respectively. After the reference pressure difference is determined, pressure readings from the first and second pressure gauges are measured again during subsequent fabrication processes but before the plasma related process is started. The difference between the two readings is sent to the computer, which then causes the openings of the baffle plate to be adjusted accordingly until the difference in the readings matches the reference pressure difference. Through the use of such adjustable-openings baffle member and modifications in the fabrication chamber, the effect of accumulations of particulate objects on the baffle plate can be neutralized, and the pressure inside the active fabrication chamber can be accurately controlled.

Figure 8:
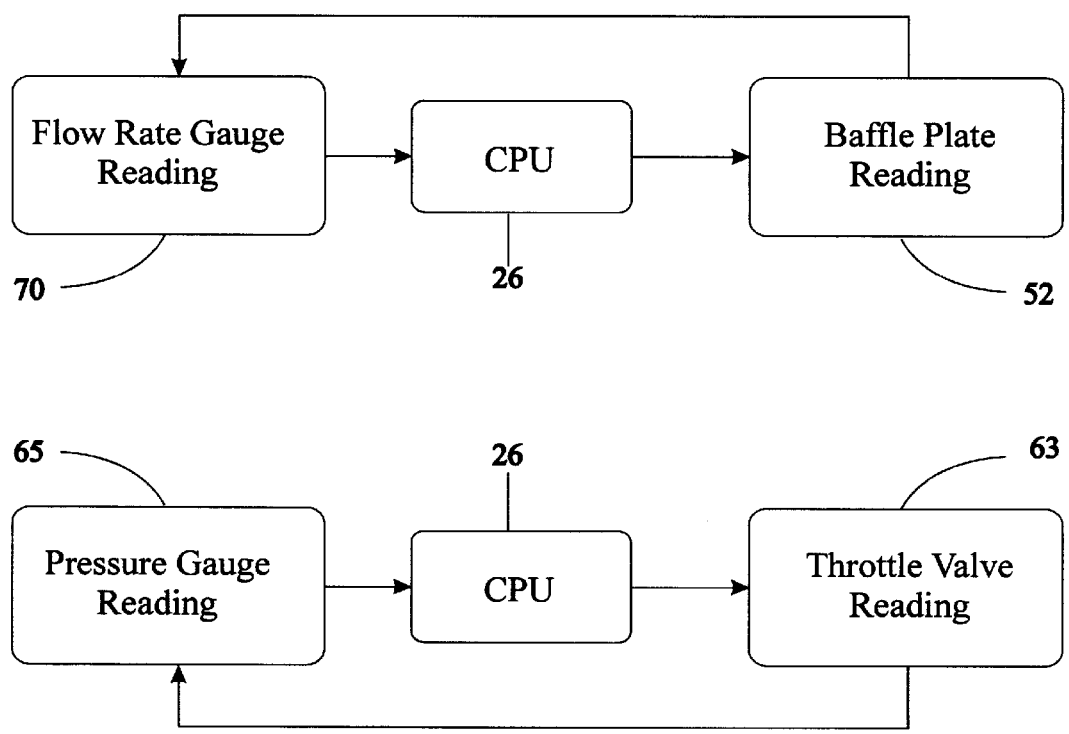
FIG. 8 is a flowchart diagram illustrating the pressure control process within the semiconductor fabrication chamber according to another preferred embodiment of the present invention which utilizes a pressure gauges near the pump inlet and a flow meter near the gas inlet

The present invention as described in the first embodiment can be modified so that the baffle openings can be adjusted during the fabrication of semiconductors. In this second embodiment, a flow rate meter can be installed inside the active fabrication chamber, in addition to or in place of the second pressure gauge. This change is particularly useful when the fouling is so significant that the baffle plate openings need to be adjusted during fabrication, so as to provide accurate pressure readings. FIG. 8 is a flowchart diagram illustrating the pressure and flow rate control process within the semiconductor fabrication chamber according to this preferred embodiment of the present invention which utilizes a pressure gauge near the pump inlet and a flow meter near the gas inlet. In this embodiment, readings from the flow meter and the first pressure gauge are taken during normal operating conditions. The measured values are called reference flow rate and reference outlet pressure, respectively. During subsequent fabrication process, before or after the plasma related process, flow rate and pressure readings are measured at the flow meter and the first pressure gauge, respectively. These values are compared against the reference flow rate and the reference outlet pressure, respectively, in a computer. If the difference between the measured flow rate and the reference flow rate exceeds a predetermined tolerance, the computer will send a signal to adjust the openings of the baffle plate until they are equal, i.e., within the predetermined tolerance. On the other hand, if the difference between the pressure reading at the first pressure gauge and the reference outlet pressure exceeds another predetermined tolerance, the computer will send another signal to adjust the throttle valve until they are equal, i.e., withing the predetermined tolerance.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A semiconductor fabrication chamber comprising:
   (a) a main chamber;
   (b) a baffle member separating said main chamber into a first chamber and a second chamber, wherein
      (i) said first chamber contains a gas inlet, a metering device, and a supporting member to support a wafer to be fabricated;
      (ii) said second chamber contains a gas outlet, and a first pressure gauge;
   (c) a vacuum pump to pump gas through said main chamber;
   (d) a computer;
   (e) wherein said baffle member contains at least one adjustable opening which is controllable by said computer;
   (f) further wherein said semiconductor fabrication chamber further comprises a second pressure gauge installed in said first chamber which will be closed during fabricating conditions, and said computer adjusts said opening according to a pressure difference between a reading from said first pressure gauge and a reading from said second pressure gauge relative to a first predetermined value before a fabricating process begins.

2. The semiconductor fabrication chamber according to claim 1 wherein said first predetermined value is the pressure difference between a reading from said first pressure gauge and a reading from said second pressure gauge when said fabrication chamber is in a freshly cleaned condition.

3. The semiconductor fabrication chamber according to claim 1 which further comprises a flow meter installed in said first chamber which will be open during fabricating conditions, and said computer adjusts said vacuum pressure according to a flow rate difference between a reading from said flow meter and a second predetermined value.

4. The semiconductor fabrication chamber according to claim 3 wherein said second predetermined value is the reading from said flow meter when said fabrication chamber is in a freshly cleaned condition.

5. The semiconductor fabrication chamber according to claim 1 which further comprises a throttle valve and said computer adjusts said throttle value opening according to a pressure difference between a reading from said first pressure guage and a predetermined pressure value.

6. A semiconductor fabrication chamber comprising:
   (a) a main chamber;
   (b) a baffle member separating said main chamber into a first chamber and a second chamber, wherein
      (i) said first chamber contains a gas inlet, a metering device, and a supporting member to support a wafer to be fabricated;
      (ii) said second chamber contains a gas outlet, and a first pressure gauge;
   (c) a vacuum pump to pump gas through said main chamber;
   (d) a computer;
   (e) wherein said baffle member comprises two concentrically disposed baffle plates which can be computer-controllably rotated relative to each other, each of said baffle plates comprises an inner ring and a plurality of radiating fins so as to form a plurality of openings.

7. The semiconductor fabrication chamber according to claim 1 wherein said baffle member comprises two concentrically disposed baffle plates which can be computer-controllably rotated relative to each other, one of said baffle plates comprises an inner ring and a plurality of radiating fins and the other baffle plate comprises a matching ring with a plurality of openings which will be at least partially blocked by said radiating fins during operation.

8. The semiconductor fabrication chamber according to claim 1 which is used for chemical vapor deposition and plasma etching operations.

9. A method for fabricating semiconductors comprising the following steps:
   (a) obtaining a semiconductor fabricating chamber, which comprises:
      (i) a main chamber;
      (ii) a baffle member separating said main chamber into a first chamber and a second chamber, wherein said first chamber contains a gas inlet, a metering device, and a supporting member to support a wafer to be fabricated, and said second chamber contains a gas outlet, and a first pressure gauge;
      (iii) a vacuum pump to pump gas through said main chamber;
      (iv) a computer;
      (v) wherein said baffle member contains at least one adjustable opening which is controllable by said computers;
      (vi) further wherein said semiconductor fabrication chamber further comprises a second pressure gauge installed in said first chamber which will be closed during fabricating conditions, and said computer adjusts said opening according to a pressure difference between a reading from said first pressure gauge and a reading from said second pressure gauge relative to a first predetermined value before a fabricating process begins; and
   (b) using said computer to adjust said adjustable opening so as account for particulate deposition causing said opening to be reduced if unadjusted.

10. The method for fabricating semiconductors according to claim 9 wherein said first predetermined value is the pressure difference between a reading from said first pressure gauge and a reading from said second pressure gauge when said fabrication chamber is in a freshly cleaned condition.

11. The method for fabricating semiconductors according to claim 9 wherein said semiconductor fabrication chamber further comprises a flow meter installed in said first chamber which will be open during fabricating conditions, and said computer adjusts said vacuum pressure according to a flow rate difference between a reading from said flow meter and a second predetermined value.

12. The method for fabricating semiconductors according to claim 11 wherein said second predetermined value is the reading from said flow meter when said fabrication chamber is in a freshly cleaned condition.

13. The method for fabricating semiconductors according to claim 10 wherein said semiconductor fabricating chamber further comprises a throttle valve and said computer adjusts said throttle value opening according to a pressure difference between a reading from said first pressure gauge and a predetermined pressure value.

14. A method for fabricating semiconductors comprising the following steps:
   (a) obtaining a semiconductor fabricating chamber, which comprises:
      (i) a main chamber;
      (ii) a baffle member separating said main chamber into a first chamber and a second chamber, wherein said first chamber contains a gas inlet, a metering device, and a supporting member to support a wafer to be fabricated and said second chamber contains a gas outlet, and a first pressure gauge;
      (iii) a vacuum pump to pump gas through said main chamber;
      (iv) a computer;
      (v) wherein said baffle member contains at least one adjustable opening which is controllable by said computer;
      (vi) further wherein said baffle member comprises two concentrically disposed baffle plates which can be computer-controllably rotated relative to each other, each of said baffle plates comprises an inner ring and a plurality of radiating fins so as to form a plurality of openings; and
   (b) using said computer to adjust said adjustable opening so as account for particulate deposition causing said opening to be reduced if unadjusted.

15. The method for fabricating semiconductors according to claim 9 wherein said baffle member comprises two concentrically disposed baffle plates which can be computer-controllably rotated relative to each other, one of said baffle plates comprises an inner ring and a plurality of radiating fins and the other baffle plate comprises a matching ring with a plurality of openings which will be at least partially blocked by said radiating fins during operation.

16. The method for fabricating semiconductors according to claim 9 wherein said semiconductor fabrication chamber is designed for chemical vapor deposition and plasma etching operations.

* * * * *